United States Patent [19]

Nakabayashi

[11] Patent Number: 4,983,918

[45] Date of Patent: Jan. 8, 1991

[54] MAGNETIC RESONANCE IMAGING SYSTEM

[75] Inventor: Kazuto Nakabayashi, Ootawara, Japan

[73] Assignee: Kabushiki Kaisha Toshiba, Kawasaki, Japan

[21] Appl. No.: 399,930

[22] Filed: Aug. 29, 1989

[30] Foreign Application Priority Data

Aug. 31, 1988 [JP] Japan .................................. 63-214920

[51] Int. Cl.$^5$ ........................................... G01R 33/20
[52] U.S. Cl. .................................... 324/309; 324/307
[58] Field of Search ............... 324/300, 307, 309, 310, 324/311, 312, 313, 318, 319, 320, 322

[56] References Cited

U.S. PATENT DOCUMENTS

| 4,300,896 | 11/1981 | Harrison | 324/309 |
| 4,424,488 | 1/1984 | Hounsfield | 324/309 |
| 4,667,159 | 5/1987 | Hodsoll | 324/309 |
| 4,683,433 | 7/1987 | Yamamoto | 324/309 |
| 4,766,379 | 8/1988 | Miyazaki | 324/309 |
| 4,833,407 | 5/1989 | Holland | 324/309 |
| 4,864,241 | 9/1989 | Goldie | 324/318 |

OTHER PUBLICATIONS

Cho et al., "Total Inhomogeneity Correction including Chemical Shifts and Susceptibility by View Angle Tilting", Medical Physics 15(1), Jan./Feb. 1988, pp. 7-11.

Primary Examiner—Michael J. Tokar
Attorney, Agent, or Firm—Foley & Lardner, Schwartz, Jeffery, Schwaab, Mack, Blumenthal & Evans

[57] ABSTRACT

A magnetic resonance imaging system includes a static magnetic field generating section, a gradient magnetic field applying section, an RF pulse applying section, a sequence control section, a receiving section, and an imaging processing section. The sequence control section controls a sequence so as to generate a 180° pulse at a timing at which a peak of the 180° pulse appears at $t = TE'/2$, assuming that $TE' = TE - n\tau c$ (where TE is the echo time for a proton, $\tau c$ is the period in which phases of spins of water and fat match with each other and which is obtained on the basis of a chemical shift amount of protons of water and fat, and n is an integer of 1 or more), and a peak of a 90° pulse appears at $t = 0$, generate a read gradient magnetic field Gr whose strength condition is set to cause an echo peak to appear at $t = TE = TE' + n\tau c$, and generate a second 180° pulse at $T\pi 2$ for an echo time TE2' for a second MR echo signal $T\pi 2 = (TE2' - TE1)/2.$ 8 Claims, 5 Drawing Sheets

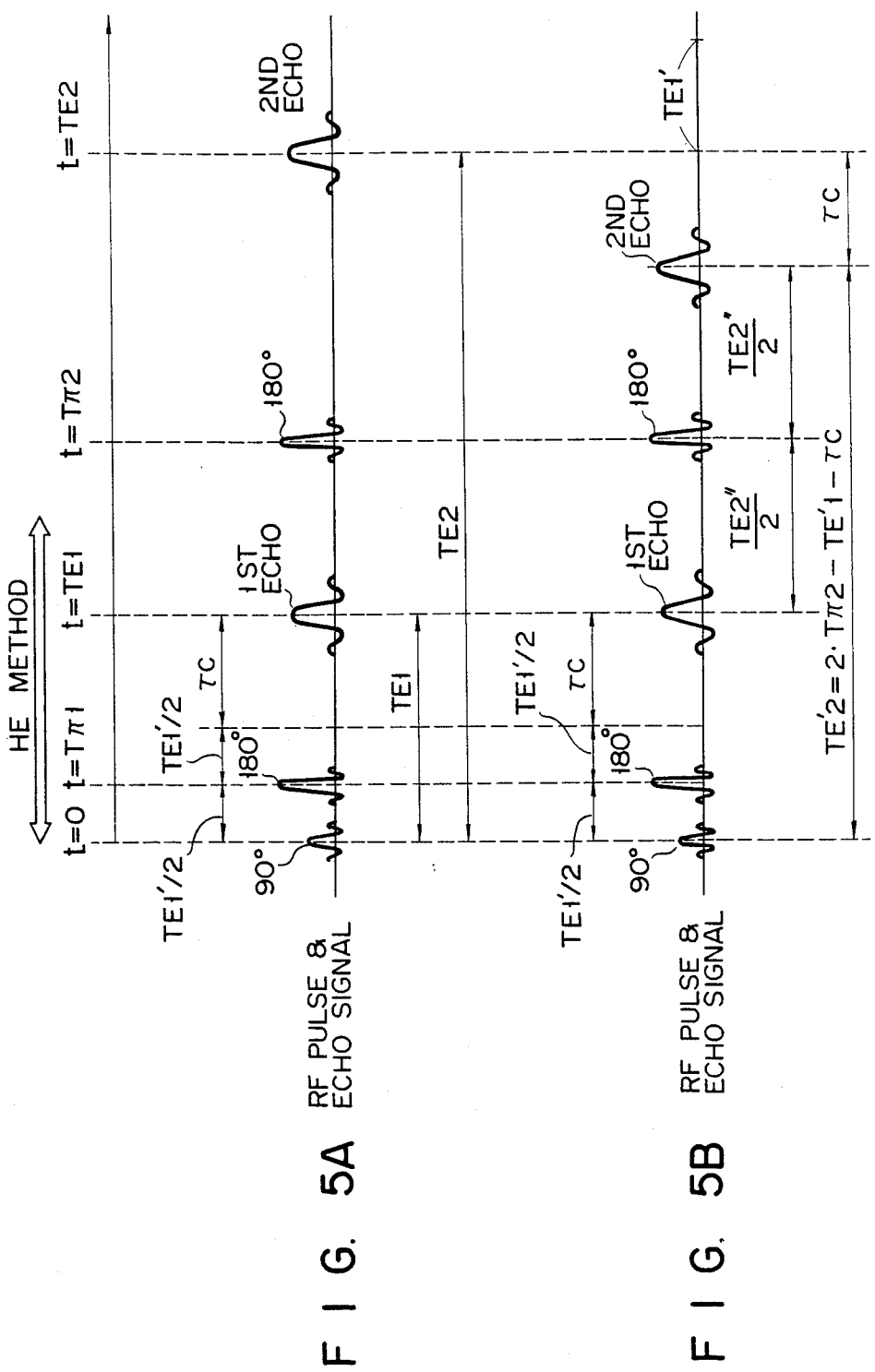

MAGNETIC RESONANCE IMAGING SYSTEM

BACKGROUND OF THE INVENTION

1. Field of the Invention

The present invention relates to a magnetic resonance imaging (MRI) system for applying a gradient magnetic field and an RF pulse to an object to be examined which is placed in a static magnetic field so as to excite magnetic resonance at a specific portion of the object, and acquiring magnetic resonance (MR) echo signals excited by the magnetic resonance, thereby imaging the specific portion by a predetermined image reconstruction method using data based on the acquired MR echo signals and, more particularly, an improvement of multi-echo sequence in a spin echo method (to be referred to as an SE method hereinafter) using 90°-180° series RF pulses.

2. Description of the Related Art

In a general medical MRI system, a gradient magnetic field and an RF pulse are applied to an object to be examined which is placed in a static magnetic field in accordance with a predetermined sequence for magnetic resonance excitation/MR data acquisition so as to cause an MR phenomenon at a specific portion of the object, and an MR signal excited by the MR phenomenon is detected. In addition, according to the system, data processing for imaging which includes image reconstruction is performed for MR data acquired in this manner so as to image anatomical information or quality information of the specific portion of the object.

An MRI system of this type generally comprises a static magnetic field generator, X-axis, Y-axis, and Z-axis gradient magnetic field generators, an RF transmitter, and an RF receiver. The X-axis, Y-axis, and Z-axis gradient magnetic field generators and the RF transmitter are driven in accordance with a predetermined sequence so as to generate X-axis, Y-axis, and Z-axis gradient magnetic fields Gx, Gy, and Gz and an RF pulse in accordance with a predetermined sequence pattern. As a result, MR is excited to generate an MR signal, and the MR signal is received by the receiver. Predetermined image processing including image reconstruction processing is performed for the received MR data. In this manner, a tomographic image of a certain slice portion of an object to be examined is generated and displayed on a monitor.

In the sequence for magnetic resonance excitation/MR data acquisition, the X-axis, Y-axis, and Z-axis gradient magnetic fields Gx, Gy, and Gz are respectively used as, e.g., a read gradient magnetic field Gr, an encode gradient magnetic field Ge, and a slicing gradient magnetic field Gs.

One of the conventional MR methods widely used in such a system is an imaging method employing the sequence of the SE method which uses 90°-180° series RF pulses. According to the sequence of the SE method, data acquisition can be performed by a multi-echo sequence in which a plurality of MR echoes are sequentially generated upon one MR excitation and the respective data are sequentially acquired. This SE method is often used for MR data acquisition using the multi-echo sequence.

The sequence of such a conventional SE method will be described below with reference to FIG. 1. FIG. 1 shows a sequence in one encode step.

A slicing gradient magnetic magnetic field Gs and a 90° selective excitation pulse as an RF magnetic field are applied to an object to be examined so as to excite a specific slice of the object (to flip the magnetization vector (to be referred to as "nuclear magnetization" hereinafter) of the nuclear spin of a specific atomic nucleus in the slice through 90°). Thereafter, an encode gradient magnetic field Ge having an amplitude corresponding to the encode step is applied to the object, and a 180° pulse as an RF magnetic field is applied to the object so as to invert the nuclear magnetization, thereby rephasing and refocusing the rotational phase of the nuclear magnetization (which has been dephased and dispersed upon application of the 90° pulse). In addition, a read gradient magnetic field Gr is applied to the object to generate an MR echo signal whose peak appears after a TE time (echo time) from the peak of the 90° pulse. While the read gradient magnetic field Gr is applied to the object, the MR echo signal is acquired.

The above-described sequence is repeated while the amplitude of the encode gradient magnetic field Ge, which is applied between application of 90° and 180° pulses, is changed by a predetermined value in every encode step. When the second and subsequent multi-echo signal data are to be acquired, an operation of applying a 180° pulse to the object after a time TE/2 from the peak of the immediately preceding echo signal and applying a read gradient magnetic field Gr to the object is repeated, thereby sequentially acquiring echo signals each having a peak appearing after a time TE/2 from the peak of each 180° pulse.

In the sequence of the SE method, in order to minimize the influences of inhomogeneity of a static magnetic field, time $t=0$ at which a 90° pulse is applied, time $t=T\pi$ at which a 180° pulse is applied, and time $t=TE$ at which the peak of a spin echo signal appears must satisfy the following equation:

$$T\pi = TE/2$$

In this case, preferably, the earliest timing at which echo signal acquisition can be started comes at a point A in FIG. 1 after application of a 180° pulse having a pulse time width TW, at which the leading edge of the read gradient magnetic field Gr is stabilized after the trailing edge of the slicing gradient magnetic field Gs. If data acquisition is to be performed in a symmetrical manner with respect to the echo peak at time $t=TE$, an echo signal acquisition time Taq is limited as follows:

$$TE - Tw - 2\alpha \geq Taq$$

where is either the fall time of a slicing gradient magnetic field Gs or the rise time of a read gradient magnetic field Gr. If the resolution remains the same, the upper limit of the time Taq is determined by TE, Tw, and α. In addition, since the strength of a gradient magnetic field cannot be much decreased and $$\text{Noise} \propto 1/\sqrt{Taq}$$

the signal-to-noise (S/N) ratio cannot be increased.

As described above, according to the conventional system, a time ½ the echo time (the time interval between the peak of a 90° pulse and the peak of an echo signal) TE is set to be a time Tπ, and a 180° pulse is applied. That is, $$TE/2 = T\pi$$

Therefore, the upper limit of the echo signal acquisition time Taq is determined as $TE-Tw-2\alpha \geq Taq$, and an increase in S/N ratio is undesirably limited when the resolution and the TE time remain the same.

In recent years, however, techniques for obtaining homogeneity of a static magnetic field has progressed in MRI systems, and hence inhomogeneity of a static magnetic field can be reduced to such an extent that no problem is posed in practical use.

SUMMARY OF THE INVENTION

It is an object of the present invention to provide an MRI system in which an observation time of an MR echo signal is prolonged to increase an S/N ratio with respect to a given resolution and a given TE time and to enhance the degree of freedom of generation timings of a second MR echo signal.

An MRI system according to the present invention comprises a static magnetic field generating section for generating a homogeneous static field in a predetermined imaging volume, a gradient magnetic field applying section for applying a gradient magnetic field to the volume, an RF pulse applying section for applying RF pulses to the volume, a sequence control section for controlling the gradient magnetic field applying section and the RF pulse applying section in accordance with a predetermined sequence using a gradient magnetic field and 90°-180° series RF pulses based on a two-dimensional Fourier transform method, thereby causing an MR phenomenon, a receiving section for receiving an MR signal generated in the volume by the MR phenomenon, and an imaging processing section for performing predetermined processing including image reconstruction processing for the MR signal so as to obtain an MR image. The sequence control section is designed to generate a 180° pulse at a timing at which a peak of the 180 pulse appears at $t=TE1'/2$, assuming that $TE1'=TE1-n\tau c$ (where TE1 is the echo time for a proton, $\tau c$ is the period in which phases of spins of water and fat match with each other and which is obtained on the basis of a chemical shift amount of protons of water and fat, and n is an integer of 1 or more), and a peak of a 90° pulse appears at $t=0$, generate a read gradient magnetic field Gr whose strength condition is set to cause an echo peak to appear at $t=TE1=TE1'+n\tau c$, and set a pulse application time $T\pi m$ for applying second and subsequent 180° pulses to the echo time TEm' for an mth (m is an integer of 2 or more) echo time as the second or subsequent MR echo signal as follows:

$T\pi m = (TEm' - TEm - 1)/2$ (i.e., if m=2, then TEm-1 is TE1).

According to the MRI system of the present invention, the following effects can be obtained. An echo signal acquisition time can be set to be longer than that in the conventional SE method. In addition, Nuclear magnetization whose phase shift occurs due to chemical shift can be phase-matched at an echo peak.

More specifically, (a) since Taq' can be set beyond the limitation of $TE-Tw-2\alpha \geq Taq$, the echo signal acquisition time can be prolonged, and the S/N ratio can be increased, assuming that the resolution and the TE time remain the same. (b) The nuclear magnetization whose frequency shift occurs due to chemical shift with respect to a specific atomic nucleus, e.g., a proton, can be phase-match at the echo peak. (c) If the TE time remains the same, the same contrast as that of the conventional system can be obtained. (d) With regard to spins in which frequency shift occurs due to factors other than chemical shift, their phases are not matched at the echo peak. Therefore, with respect to a portion in an object to be examined in which susceptibility locally varies, an echo signal exhibits the same characteristics as those of an echo signal obtained by a field echo method. That is, a portion whose susceptibility locally varies (e.g., nucleus ruber) can be expressed with a higher contrast than that in the normal SE method. (e) The echo time TE (i.e., TE2') for the second MR echo signal can be set by the period $\tau c$ required for phase-matching the nuclear magnetization whose phase is changed by chemical shift with the nuclear magnetization whose phase is not changed by the chemical shift in accordance with the time TE2 determined by the multi-echo sequence (when a multi-echo method is simply applied). The echo time TE for the second MR echo signal can be set for the time $TE2'(=2T\pi 2 - TE1' - \tau c)$ shorter than a limitation $TE2(=2T\pi 2 - TE1')$ of the minimum echo time TE for the second MR echo signal in the multi-echo sequence. Therefore, the degree of freedom for selecting the echo time TE in a clinical diagnosis can be increased.

According to the MRI system of the present invention, when the multi-echo method is applied, the S/N ratio in MR echo signal acquisition can be improved, and at the same time, the degree of freedom for selecting the echo time for the second and subsequent MR echo signals can be increased, thus providing clinical advantages.

BRIEF DESCRIPTION OF THE DRAWINGS

FIGS. 5A and 5B are views for comparing a pulse sequence obtained by simply applying the multi-echo sequence to a hybrid echo method with a pulse sequence in the system shown in FIG. 3.

DETAILED DESCRIPTION OF THE PREFERRED EMBODIMENTS

Figure 1:
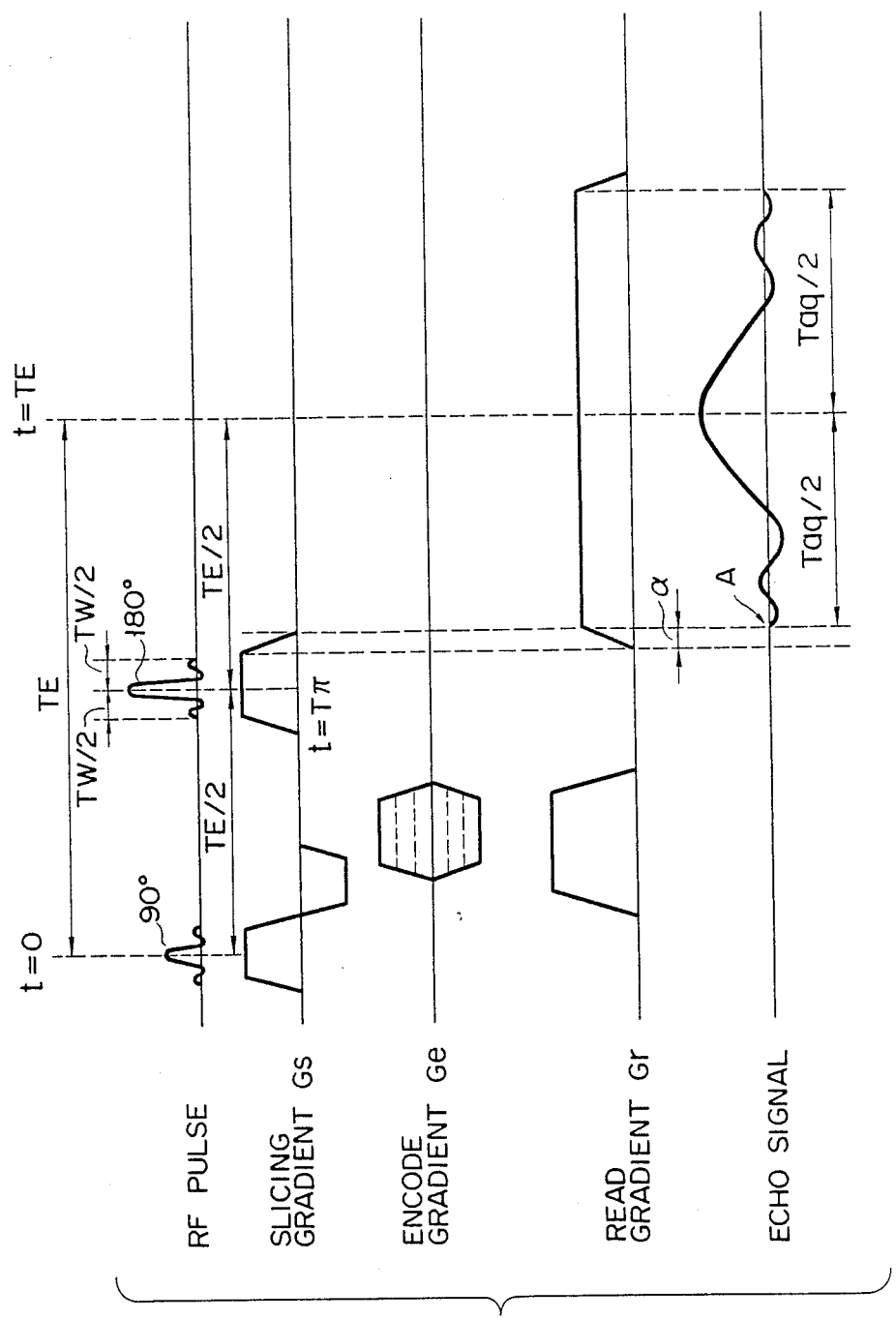
FIG. 1 is a timing chart showing a pulse sequence in a conventional MRI system.

A sequence on which the present invention is based, i.e., a hybrid echo method (to be referred to as an "HE method" hereinafter) in which the normal SE method is improved to increase an S/N ratio will be described below prior to the description of an MRI system according to a first embodiment of the present invention. The HE method has been disclosed by the present inventors (U.S. patent application Ser. No. 07/354,762; inventors: Kazuto Nakabayashi and Masatoshi Hanawa; and title: "Magnetic Resonance Imaging System and Method").

The HE method is based on the normal SE method. In the HE method, the application timing of a 180° pulse is shifted toward the 90° pulse side by an interval corresponding to one period of a chemical shift so as to prolong a data acquisition time, so that the S/N ratio is increased to nearly $\sqrt{2}$ times that of the SE method.

More specifically, according to the HE method, $TE' = TE - n\tau c$ (where TE is the echo time for a proton, $\tau c$ is the period in which the phases of the nuclear magnetization of water and fat match with each other, and which is based on the chemical shift amount of the protons of water and fat, and n is an integer of 1 or more) is set. In this method, if the timing of the peak of a 90° pulse is represented by $t=0$, a 180° pulse is generated at a timing at which the timing of the peak of the 180° pulse is given by $t = TE'/2$, and a read gradient magnetic field Gr is generated while its strength is set to cause an echo peak to appear at a timing $t = TE = TE' + n\tau c$. According to this system, an echo signal acquisition time can be prolonged, and hence an S/N ratio can be increased, assuming that a resolution and a TE1 time remain the same. Even if nuclear magnetization causes frequency shift due to chemical shift with respect to a proton, its phase is matched at the echo peak. In addition, if frequency shift of nuclear magnetization occurs due to factors other than chemical shift, the pulse sequence can be set so as not to match its phase at the echo peak.

Since the time Taq' can be set beyond the limitation of $TE - Tw - 2\alpha \geq Taq$, the S/N ratio can be increased, assuming that the resolution and the TE time remain the same. In addition, if the TE time remains the same, the same contrast as that of the conventional system can be obtained. With regard to spins in which frequency shift occurs due to factors other than chemical shift, their phases do not match with the echo peak. Therefore, with respect to a portion in an object to be examined in which susceptibility locally varies, an echo signal exhibits the same characteristics as those of an echo signal obtained by a field echo method. That is, a portion whose susceptibility locally varies (e.g., nucleus ruber) can be expressed with a higher contrast than that in the normal SE method.

According to the HE method, therefore, an S/N ratio with respect to a given resolution and a given TE time can be increased.

A practical example of the HE method will be described in detail below with reference to FIG. 2.

The sequence of the HE method is based on the sequence of the SE method in which 90°–180° series RF pluses are applied, and is formed on the basis of the echo time TE of the sequence of the SE method as follows:

(1) The resonance frequency of a proton (hydrogen atomic nucleus) of water (contained in water) with respect to a static magnetic field generated by the system is obtained.

(2) Since the chemical shift amount of a proton of water and a proton of fat (contained in fat) is approximately ppm with respect to the resonance frequency, a time (period) $\tau c$ in which the phases of nuclear magnetization of water and fat match with each other is obtained in accordance with the following equation:

$\tau c$ (sec) = 1/[resonance frequency (Hz) of water chemical shift amount (ppm) of water and fat]

(3) A time given by $TE - \tau c$ is set to be TE' with respect to the predetermined echo time TE.

(4) Application timings of 90° and 180° pulses are determined such that the peaks of the 90° and 180° pulses respectively appear at time $t=0$ and time $t = TE'/2$.

Figure 2:
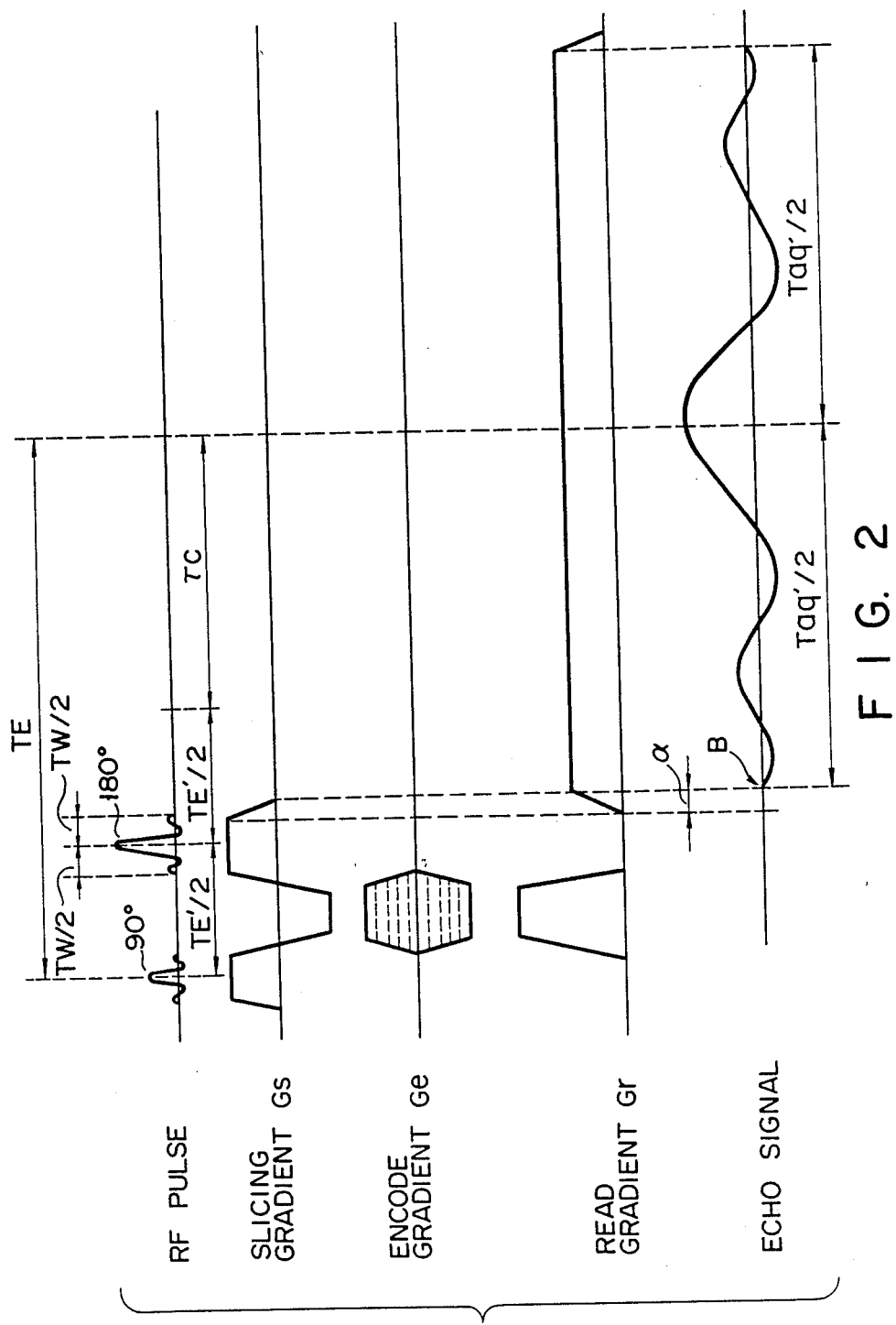
FIG. 2 is a timing chart for explaining a fundamental pulse sequence of a hybrid echo method which is employed in an MRI system of the present invention to obtain echoes.

(5) The earliest timing at which data acquisition can be started is at a point B in FIG. 2 immediately after application of a 180° pulse. For example, when data acquisition is to be performed in a symmetrical manner with respect to the peak (time $t = TE$) of an echo signal, data acquisition can be performed in a time interval Taq'.

(6) A slicing gradient magnetic field Gs, a read gradient magnetic field Gr, and a phase encode gradient magnetic field Ge are basically controlled in the same manner as in the normal spin echo sequence. However, the strength of the read gradient magnetic field Gr is set such that an echo peak does not appear at time $t = TE'$ but appears at time $t = TE' + \tau c$, i.e., $t = TE$, and a desired resolution $\Delta l$ is obtained with respect to the time interval Taq'. In this case, the resolution $\Delta l$ is given as $\Delta l = 1/[\text{Taq}'$ strength of Gr in the time interval Taq], and a timing at which an echo peak appears is determined in association with the intensity and application period of the read gradient magnetic field Gr before and after application of a 180° pulse (between application of a 90° pulse and that of a 180° pulse). Therefore, the strength of the read gradient magnetic field Gr in the time interval Taq' is set to satisfy the resolution $\Delta l$, and the strength of the read gradient magnetic field before application of a 180° pulse is determined to cause an echo peak to appear at time $t = TE1$.

Unlike the pulse sequence of the normal SE method, the pulse sequence of the HE method is susceptible to the influences of inhomogeneity of a static magnetic field. For this reason, an MRI system must be constructed by using a static magnetic field magnet system capable of obtaining a highly homogeneous static magnetic field. For example, if a static magnetic field strength is 0.5 T, a diameter of a spherical volume DSV (an imaging allowable volume, i.e., a spherical volume in which an imaging field is formed and approximately in which diagnosis can be performed) is preferably set to be 250 mm, and inhomogeneity is preferably set to be several ppm or less.

According to the above-described HE method, if condition (2) described above, i.e., $\tau c = 1/[\text{resonance}$ frequency (Hz) of water [chemical shift amount (ppm) of water and fat], is satisfied, an image having substantially the same contrast with that of an image obtained by the conventional system can be obtained. If the resolution of an image remains the same, noise of the image can be reduced by a value corresponding to $1/\sqrt{(\text{Taq}'/\text{Taq})}$. As a result, the S/N ratio can be increased.

In the HE method described above, if the central timing of the 90°-pulse application is set to be $t=0$ and $TE' = TE - n\tau c$ (where TE is the echo time for a proton, $\tau c$ is the period in which the phases of the nuclear magnetization of water and fat match with each other, and which is based on the chemical shift amount of the protons of water and fat, and n is an integer of 1 or more) is set, the central timing of the 180°-pulse application is set to be $t = TE'/2$ and the echo signal acquisition time Taq' is set to satisfy inequality $Taq' > TE - Tw - 2\alpha$. According to the HE method, therefore, the MR echo signal acquisition time can be prolonged. In addition, according to the HE method, nuclear magnetization of the spin of the proton of the fat which is phase-shifted from the proton of water by chemical shift can be phase-matched at an echo peak. In addition, nuclear magnetization of the spins subjected to frequency shifts caused by reasons other than the chemical shift is not phase-matched at the echo peak.

The echo signal acquisition time Taq' can be set beyond the limitation defined by inequality $TE - Tw$-

$-2\alpha \geq T_{aq}$, so that an S/N ratio can be increased when the resolution and the echo time TE are kept unchanged. If the echo time TE is kept unchanged, an identical contrast level can be obtained. In addition, portions having different magnetization ratios have higher contrast levels by the feature of the spin echo method.

When the multi-echo sequence similar to the conventional SE method is applied to the above HE method, as shown in FIG. 5A, since the influence of inhomogeneity of the static field, the echo time TE=TE2 for the second MR echo signal cannot be set earier than $TE2 = 2T\tau 2 - TE1'$.

In practice, the shorter the minimum echo time TE2 for the second MR echo signal in the multi-echo sequence is, the higher the degree of freedom for clinical applications becomes. However, when the conventional multi-echo sequence is simply applied to the HE method, the above limitations are imposed.

According to an aspect of the present invention, the multi-echo sequence for the HE method can be improved, and the degree of freedom for selecting the echo time for the second and subsequent MR echo signals can be increased.

Figure 3:
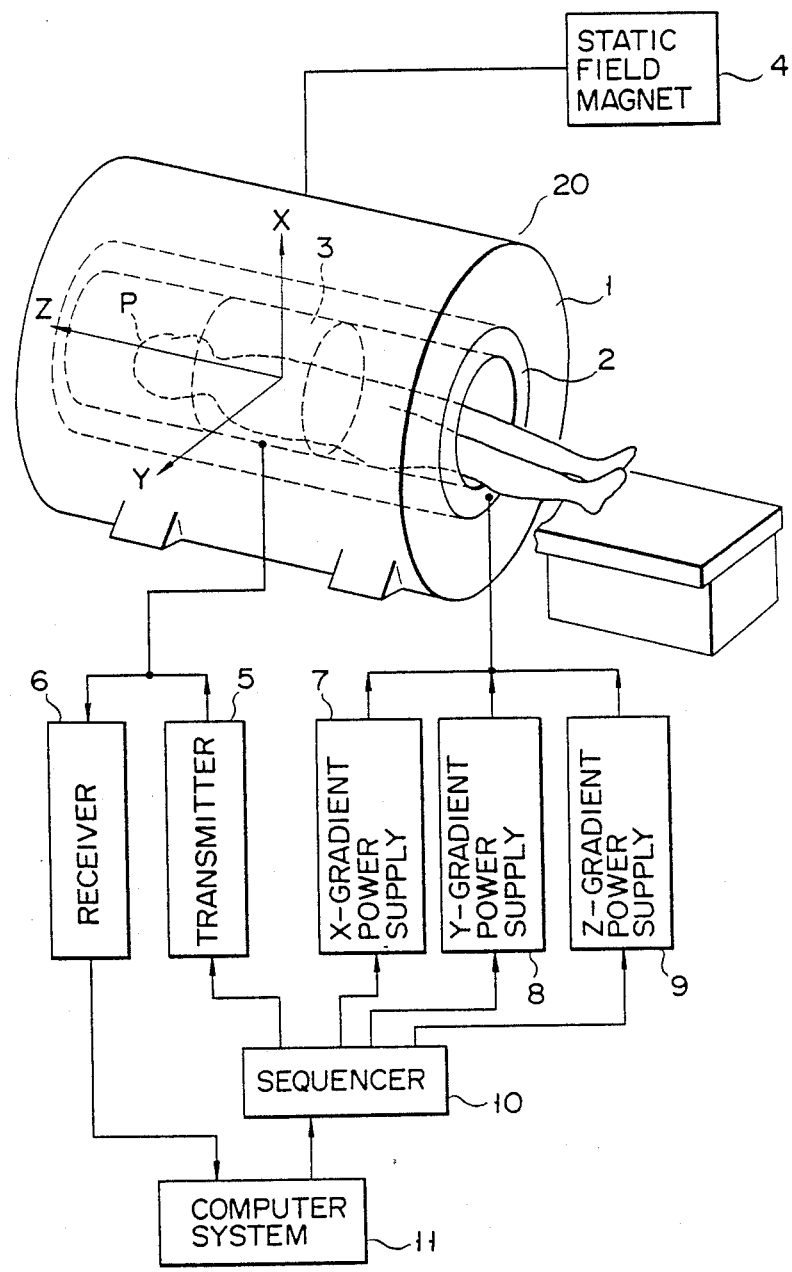
FIG. 3 is a block diagram showing an arrangement of an MRI system according to an embodiment of the present invention.

An arrangement of an MRI system according to an embodiment of the present invention will be described with reference to FIG. 3.

A static field magnet 1, X-axis, Y-axis, and Z-axis gradient magnetic field coils 2, and a transmitting-/receiving coil 3 are arranged in a gantry 20. The static field magnet 1 as a static field generator is constituted by, e.g., a superconductive coil or a resistive coil. The X-axis, Y-axis, and Z-axis gradient magnetic field coils 2 are coils for respectively generating X-axis, Y-axis, and Z-axis gradient magnetic fields Gx, Gy, and Gz. The transmitting/receiving coil 3 is used to generate an RF pulse and receive an MR signal generated by MR. An object (patient) P to be examined is inserted in an imaging allowable volume (i.e., a spherical volume in which an imaging magnetic field is formed, so that a diagnosis can be performed approximately within this spherical volume) in the gantry 20.

The static field magnet 1 is driven by a static field controller 4. The transmitting/receiving coil 3 is driven by a transmitter 5 when MR is excited, and is coupled to a receiver 6 when an MR signal is detected. The X-axis, Y-axis, and Z-axis gradient magnetic field coils 2 are respectively driven by X-, Y-, and Z-gradient power supplies 7, 8, and 9.

The X-, Y-, and Z-gradient power supplies 7, 8, and 9, and the transmitter 5 are driven by a sequencer 10 in accordance with a predetermined sequence so as to respectively generate X-axis, Y-axis, and Z-axis gradient magnetic fields Gx, Gy, and Gz, and RF pulses of, e.g., 90°–180° pulse series in accordance with a predetermined pulse sequence (to be described layer). In this case, X-axis, Y-axis, and Z-axis gradient magnetic fields Gx, Gy, and Gz are mainly used as, e.g., a read gradient magnetic field Gr, an encode gradient magnetic field Ge, and a slicing gradient magnetic field Gs, respectively. A computer system 11 drives/controls the sequencer 10. In addition, the computer system 11 fetches a spin echo signal as an MR signal received by the receiver 6 and performs predetermined signal processing to generate tomographic image of a specific slice portion of an object to be examined, thus displaying it on a display monitor.

Figure 4:
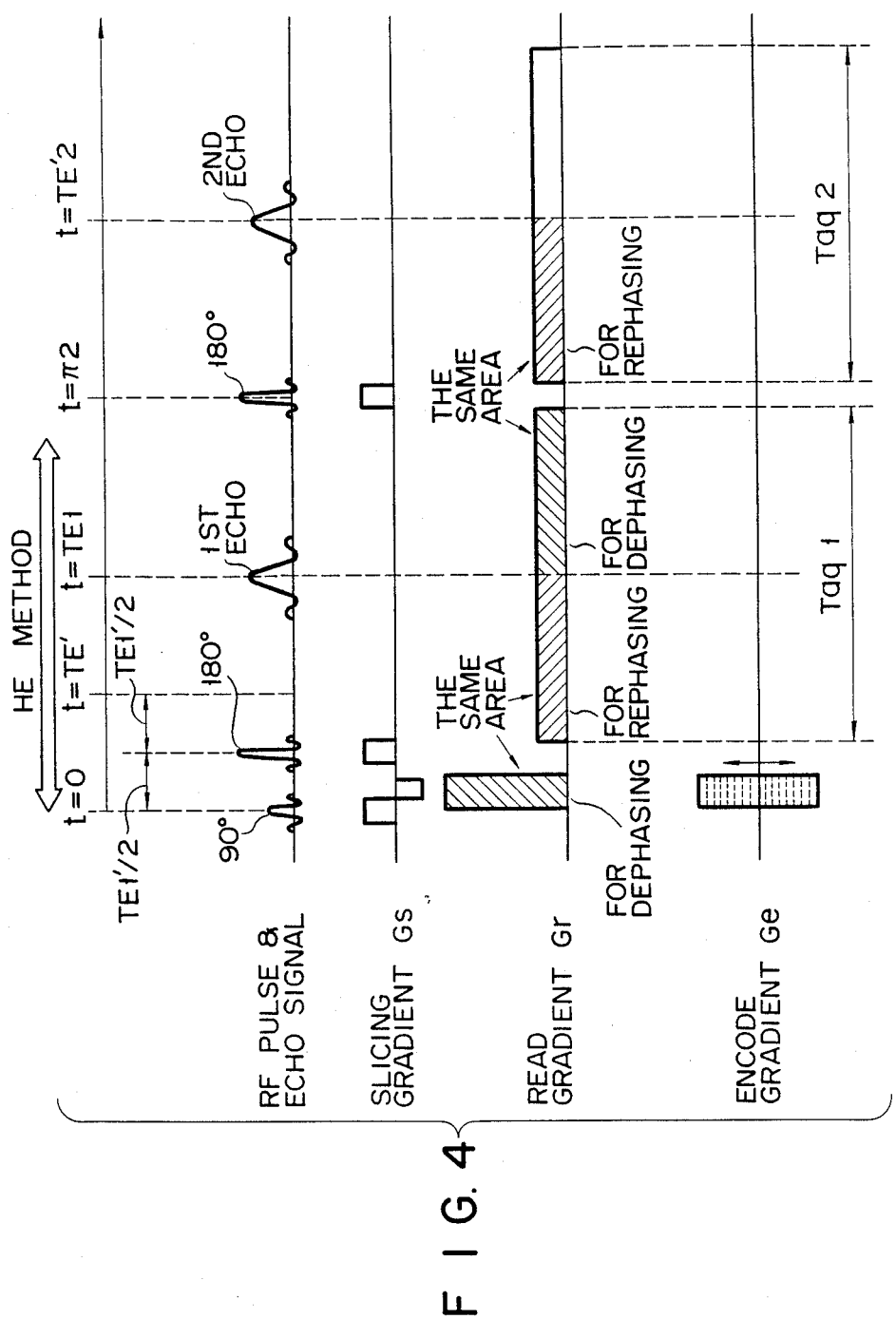
FIG. 4 is a timing chart for explaining a pulse sequence of the system in FIG. 3 in detail.

A pulse sequence for MR excitation/MR data acquisition in the above-described MRI system according to an embodiment of the present invention will be described below with reference to FIG. 4.

In this embodiment, an improved multi-echo sequence of the HE method is constituted by procedures (1) to (6).

(1) A resonance frequency of a proton in a system which employs the present invention is obtained, and this resonance frequency is defined as f0.

(2) A frequency fc of a chemically shifted fat spin is obtained, and a time $\tau c$ corresponding to one period of a differential frequency between the shifted spin and a spin which is not shifted is obtained by the following equation:

$$\tau c = 1/|f0 - fc|$$

In this case, a chemical shift amount ($|f0-fc|/f0$) is about 3 to 4 ppm, and the frequency f0 can be uniquely determined if the static magnetic field strength of the apparatus is determined. In addition, the time $\tau c$ may be set to a typical value within the range of chemical shift amounts.

(3) A sequence timing is set such that a 180° pulse is applied with a delay from a 90° pulse by $(TE1'/2) = \{(TE1 - \tau c)/2\}$ for the echo time TE=TE1 for a desired first MR echo signal.

(4) The read gradient field Gr determines an area of dephase and rephase gradient field waveform portions such that an MR echo signal peak accurately appears at t=TE1. Other gradient fields can be set by a conventional two-dimensional Fourier transform (2DFT).

The observation of the MR echo signal can possibly be started immediately after the end of the first 180° pulse.

The procedures (1) to (4) are the same as those of the HE method.

(5) The time $T\pi 2$ for applying the second 180° pulse is set to be $T\pi 2 = (TE2' - TE1)/2 = TE2''/2$ for the echo time TE=TE2' for a desired second MR echo signal.

(6) The dephase and rephase gradient field portions of the read gradient field Gr are adjusted such that the peak position of the second MR echo signal is set at t=TE2. Other gradient fields can be set by the multi-echo sequence applied to the conventional spin echo method.

In the system of this embodiment which employs an improved new multi-echo sequence applied to the HE method, a minimum TE2 can be set to be $TE2'(=2T\pi 2 - TE1' - \tau c)$ shorter by $\tau c$ as compared with a case in which the conventional multi-echo sequence is simply applied to the HE method. That is, the echo time TE2 for the second MR echo signal can be set to be shorter than that of the conventional multi-echo sequence by $\tau c$ (therefore, the range of the echo time TE2 for the second MR echo signal can be set to be TE2' or more). The degree of freedom for selecting the echo time TE2 for the second MR echo signal in the multi-echo sequence which uses the HE method can be increased.

More specifically, when the conventional multi-echo sequence is applied to the HE method in which an MR echo signal is acquired with a delay by $\tau c$ (i.e., a time required to phase-match the nuclear magnetization of the chemically shifted spin and the nuclear magnetization of the nonshifted spin again) from a position where a spin echo by a 90°–180° pulse sequence appears, the echo time TE for the second MR echo signal cannot be shorter than $TE2=2\cdot T\pi 2-TE1'$ (FIG. 5A). To the contrary, in this embodiment of the present invention, as shown in FIG. 5B, the first MR echo signal is generated according to the HE method, and the second 180° pulse application time T 2 for the second MR echo signal is set to be $T\pi 2=(TE2'-TE1)/2$. Therefore, the echo time TE=TE2 for the second MR echo signal can be shortened to $TE2'=2T\pi 2-TE1'-\tau c$.

The above description exemplifies acquisition of the second MR echo signal. However, the same processing can be performed for the third and subsequent MR echo signals by setting the following relation. That is, the time $T\pi m$ for applying the second and subsequent 180° pulses for the echo time TEm' for the mth MR echo signal (m is an integer of 2 or more) after the second MR echo signal is defined as follows:

$$T\pi m=(TEm'-TEm-1)/2$$

The present invention is not limited to the particular embodiment described above. Various changes and modifications may be made without departing the spirit and scope of the invention.

For example, the read gradient field Gr and the slice gradient field Gr are applied, and the intensities of the read gradient field Gr and the slice gradient field Gr are set to obtain a tilting view angle $\theta=\tan^{-1}Gs/Gr$, thereby reducing the chemical shift artifacts.

What is claimed is:

1. A magnetic resonance imaging system comprising:
   static magnetic field generating means for generating a sufficiently homogeneous static magnetic field in a predetermined imaging volume in which an object to be examined is placed;
   gradient magnetic field applying means for applying a gradient magnetic field to the imaging volume;
   RF pulse applying means for applying an RF pulse to the imaging volume;
   sequence control means for controlling said gradient magnetic field applying means and said RF pulse applying means in accordance with a predetermined sequence so as to cause said gradient magnetic field applying means and said RF pulse applying means to respectively apply a predetermined gradient magnetic field and 90°-180° series RF pulses to the imaging volume, thereby causing a magnetic resonance phenomenon in the imaging volume;
   receiving means for receiving a magnetic resonance signal generated in the imaging volume by the magnetic resonance phenomenon; and
   imaging processing means for obtaining a magnetic resonance image by performing predetermined processing including image reconstruction processing for the magnetic resonance signal received by said receiving means,
   said sequence control means including means for generating a 180° pulse at a timing at which a peak of the 180° pulse appears at $t=TE'/2$, assuming that $TE'=TE-n\tau c$ (where TE is the echo time for a proton, $\tau c$ is the period in which phases of spins of water and fat match with each other and which is obtained on the basis of a chemical shift amount of protons of water and fat, and n is an integer not less than 1), and a peak of a 90° pulse appears at $t=0$, means for generating a read gradient magnetic field Gr whose strength condition is set to cause an echo peak to appear at $t=TE=TE'+n\tau c$, and means for generating a second 180° pulse at $T\pi 2$ for an echo time TE2' for a second MR echo signal $$T\pi 2=(TE2'-TE1)/2.$$

2. A system according to claim 1, wherein said sequence control means further comprises means for generating dephase and rephase read gradient fields Gr such that a peak position of the second MR echo signal is set at $t=TE2$.

3. A magnetic resonance imaging system comprising:
   static magnetic field generating means for generating a sufficiently homogeneous static magnetic field in a predetermined imaging volume in which an object to be examined is placed;
   gradient magnetic field applying means for applying a gradient magnetic field to the imaging volume;
   RF pulse applying means for applying an RF pulse to the imaging volume;
   sequence control means for controlling said gradient magnetic field applying means and said RF pulse applying means in accordance with a predetermined sequence so as to cause said gradient magnetic field applying means and said RF pulse applying means to respectively apply a predetermined gradient magnetic field and 90°-180° series RF pulses to the imaging volume, thereby causing a magnetic resonance phenomenon in the imaging volume;
   receiving means for receiving a magnetic resonance signal generated in the imaging volume by the magnetic resonance phenomenon; and
   imaging processing means for obtaining a magnetic resonance image by performing predetermined processing including image reconstruction processing for the magnetic resonance signal received by said receiving means,
   said sequence control means including means for generating a 180° pulse at a timing at which a peak of the 180° pulse appears at $t=TE'/2$, assuming that $TE'=TE-n\tau c$ (where TE is the echo time for a proton, $\tau c$ is the period in which phases of spins of water and fat match with each other and which is obtained on the basis of a chemical shift amount of protons of water and fat, and n is an integer not less than 1), and a peak of a 90° pulse appears at $t=0$, means for generating a read gradient magnetic field Gr whose strength condition is set to cause an echo peak to appear at $t=TE=TE'+n\tau c$, and means for generating an mth (where m is an integer of not less than 2) 180° pulse at $T\pi m$ for an echo time TEm' for an mth MR echo signal $$T\pi m=(TEm'-TEm-1)/2.$$

4. A system according to claim 3, wherein said sequence control means further comprises means for generating dephase and rephase read gradient fields Gr such that a peak position of the mth MR echo signal is set at $t=TEm$.

5. A magnetic resonance imaging method of applying a predetermined gradient magnetic field and 90°-180° series RF pulses to a predetermined imaging volume in a static magnetic field in which an object to be examined is placed to cause a magnetic resonance phenomenon in a predetermined portion in the imaging volume, receiving a magnetic resonance signal generated by the magnetic resonance phenomenon, and obtaining a magnetic resonance image by performing predetermined processing including image reconstruction processing for the magnetic resonance signal, comprising:

the first step of generating a 180° pulse at a timing at which a peak of the 180° pulse appears at $t = TE'/2$, assuming that $TE' = TE - n\tau c$ (where TE is the echo time for a proton, $\tau c$ is the period in which phases of spins of water and fat match with each other and which is obtained on the basis of a chemical shift amount of protons of water and fat, and n is an integer not less than 1), and a peak of a 90° pulse appears at $t=0$, so as to generate a magnetic resonance echo signal;

the second step of generating a read gradient magnetic field Gr whose strength condition is set to cause an echo peak to appear at $t = TE = TE' + n\tau c$; and the third step for generating a second 180° pulse at $T\pi 2$ for an echo time TE2' for a second MR echo signal $$T\pi 2 = (TE2' - TE1)/2.$$

6. A method according to claim 5, further comprising the step of generating dephase and rephase read gradient fields Gr such that a peak position of the second MR echo signal is set at $t = TE2$.

7. A magnetic resonance imaging method of applying a predetermined gradient magnetic field and 90°-180° series RF pulses to a predetermined imaging volume in a static magnetic field in which an object to be examined is placed to cause a magnetic resonance phenomenon in a predetermined portion in the imaging volume, receiving a magnetic resonance signal generated by the magnetic resonance phenomenon, and obtaining a magnetic resonance image by performing predetermined processing including image reconstruction processing for the magnetic resonance signal, comprising:

the first step of generating a 180° pulse at a timing at which a peak of the 180° pulse appears at $t = TE'/2$, assuming that $TE' = TE - n\tau c$ (where TE is the echo time for a proton, $\tau c$ is the period in which phases of spins of water and fat match with each other and which is obtained on the basis of a chemical shift amount of protons of water and fat, and n is an integer not less than 1), and a peak of a 90° pulse appears at $t=0$, so as to generate a magnetic resonance echo signal;

the second step of generating a read gradient magnetic field Gr whose strength condition is set to cause an echo peak to appear at $t = TE = TE' + n\tau c$; and the third step of generating an mth (where m is an integer of not less than 2) 180° pulse at $T\pi m$ for an echo time TEm' for an mth MR echo signal $$T\pi m = (TEm' - TEm - 1)/2.$$

8. A method according to claim 7, further comprising the step of generating dephase and rephase read gradient fields Gr such that a peak position of the mth MR echo signal is set at $t = TEm$.

* * * * *